United States Patent
Lee

(10) Patent No.: US 8,481,362 B2
(45) Date of Patent: Jul. 9, 2013

(54) THIN FILM TRANSISTOR AND METHOD FOR PREPARING THE SAME

(75) Inventor: Jung-Hyoung Lee, Daejeon Metropolitan (KR)

(73) Assignee: LG Chem, Ltd., Seoul (KR)

(*) Notice: Subject to any disclaimer, the term of this patent is extended or adjusted under 35 U.S.C. 154(b) by 194 days.

(21) Appl. No.: 12/451,050

(22) PCT Filed: Apr. 25, 2008

(86) PCT No.: PCT/KR2008/002377
§ 371 (c)(1),
(2), (4) Date: Oct. 23, 2009

(87) PCT Pub. No.: WO2008/133457
PCT Pub. Date: Nov. 6, 2008

(65) Prior Publication Data
US 2010/0117085 A1    May 13, 2010

(30) Foreign Application Priority Data
Apr. 25, 2007  (KR) ................. 10-2007-0040313

(51) Int. Cl.
H01L 21/00    (2006.01)

(52) U.S. Cl.
USPC ............. 438/104; 438/158; 257/E29.296; 257/E21.411; 257/E21.459

(58) Field of Classification Search
USPC .... 257/E29.296, E21.411, E21.459; 438/104, 438/158
See application file for complete search history.

(56) References Cited

U.S. PATENT DOCUMENTS

| 4,514,253 A * | 4/1985 | Minezaki .................. 438/102 |
| 5,607,880 A * | 3/1997 | Suzuki et al. ............. 438/624 |
| 6,468,822 B2 | 10/2002 | Maeda et al. |
| 6,885,064 B2 | 4/2005 | You |
| 2003/0164498 A1 | 9/2003 | Sung et al. |
| 2004/0175860 A1 | 9/2004 | Park et al. |
| 2005/0024549 A1* | 2/2005 | Gotoh et al. ............... 349/43 |
| 2006/0164880 A1* | 7/2006 | Sakamoto et al. ......... 365/153 |
| 2006/0262054 A1 | 11/2006 | Yamazaki et al. |
| 2006/0273999 A1 | 12/2006 | Yamazaki et al. |
| 2006/0278606 A1 | 12/2006 | Park et al. |
| 2007/0069209 A1 | 3/2007 | Jeong et al. |
| 2007/0215881 A1* | 9/2007 | Yamamoto et al. ......... 257/79 |

FOREIGN PATENT DOCUMENTS

| CN | 1866341 A | 11/2006 |
| CN | 1870096 A | 11/2006 |

(Continued)

OTHER PUBLICATIONS

Chang Jung Kim el. al., "Highly Stable Ga2O3-In2O3-ZnO TFT for Active-Matrix Organic Light-Emitting Diode Display Application," 2006 IEEE, IEDM '06, International, Dec. 11-13, 2006, pp. 1-4.

(Continued)

Primary Examiner — Tucker Wright
(74) Attorney, Agent, or Firm — McKenna Long & Aldridge, LLP

(57) ABSTRACT

The present invention relates to a thin film transistor and a method of manufacturing the same. More particularly, the present invention relates to a thin film transistor that includes a zinc oxide (ZnO series) electrode having one or more of Si, Mo, and W as a source electrode and a drain electrode, and a method of manufacturing the same.

14 Claims, 4 Drawing Sheets

PROCESS OF THE PRESENT INVENTION

Source/Drain deposition

Photo 1 process

Develop process

Selective Dry Etch process

FOREIGN PATENT DOCUMENTS

| | | |
|---|---|---|
| EP | 1 734 150 | 12/2006 |
| JP | 06-291318 | 10/1994 |
| KR | 2000-330134 | 11/2000 |
| KR | 10-2004-0079516 A | 6/2004 |
| KR | 10-2006-0121414 | 11/2006 |
| KR | 10-2006-0131657 | 12/2006 |

OTHER PUBLICATIONS

Yutaka Ohya et. al., "Thin Film Transistor of ZnO Fabricated by Chemical Solution Deposition," Jpn. J. Appl. Phys, Sep. 27, 2000, pp. 297-298.

* cited by examiner

KNOWN LIFT-OFF PROCESS

Photo 1 process

Photo 2 process

Develop process (overhang structure)

Source/Drain deposition

Photoresist lift-off

PROCESS OF THE PRESENT INVENTION

Source/Drain deposition

Photo 1 process

Develop process

Selective Dry Etch process

THIN FILM TRANSISTOR AND METHOD FOR PREPARING THE SAME

This application claims the benefit of PCT/KR2008/002377 filed on Apr. 25, 2008, along with Korean Patent Application No. 10-2007-0040313 filed on Apr. 25, 2007, both of which are hereby incorporated herein by reference for all purposes in their entirety.

TECHNICAL FIELD

The present invention relates to a thin film transistor and a method of manufacturing the same. More particularly, the present invention relates to a thin film transistor that includes a zinc oxide (ZnO series) electrode having one or more of Si, Mo, and W as a source electrode and a drain electrode, and a method of manufacturing the same.

This application claims priority from Korean Patent Application No. 10-2007-0040313 filed on Apr. 25, 2007 in the Korean Intellectual Property Office, the disclosure of which is incorporated herein by reference in its entirety.

BACKGROUND ART

In general, a thin film transistor includes a source electrode, a drain electrode, a gate electrode, a semiconductor layer, an insulating layer, and a substrate.

A method of manufacturing a known transparent thin film transistor includes forming a semiconductor layer on a gate electrode of ITO or IZO by using a channel material such as ZnO, ZnO:Al, InZnO, ZnO:Sn, ZnO:Ga:In, and depositing the channel material or the electrode material to form source/drain electrodes. However, in the method of manufacturing the thin film transistor, the materials are very easily etched during wet etching that may be used during the etching process, and in particular, IZO having an amorphous configuration is etched in an even higher etching amount. Accordingly, in the case of when the IZO is used as the source/drain electrodes, in the etching process used in the manufacturing of the thin film transistor, since an etching selectivity of the electrode and the semiconductor layer channel is hardly present in the wet etching, many problems may occur. Accordingly, the thin film transistor is mainly manufactured by using a lift-off process.

However, the lift-off process has serious problems such as the occurrence of overhang structure due to two photoprocesses, the generation of impurity due to the deposition process in a state in which a photoresist is present, and an increase in production cost due to an additional photoprocess. Therefore, the process may be a very undesirable process that cannot be applied to a process of manufacturing a thin film transistor.

In addition to the typical process of manufacturing the thin film transistor, there is a process of additionally depositing a SiN channel protective layer on a semiconductor layer. However, this has problems in that since a channel photomask is additionally used, the manufacturing cost of the thin film transistor is increased. In addition, there is a process of controlling only an etching time without the etching selectivity during an etching process to etch the source/drain electrodes according to an etching amount. However, in this process, since the etching selectivity is not present, there is a problem in that it is very difficult to control the etching. Accordingly, it is not a desirable process of manufacturing the thin film transistor.

DISCLOSURE OF INVENTION

Technical Problem

The present invention has been made keeping in mind the problems occurring in the related art, and an object of the present invention made by the present inventors is to provide a thin film transistor and a method of manufacturing the same, in which a channel material of a semiconductor layer and a source electrode and a drain electrode can be selectively etched.

Technical Solution

The present invention provides a method of manufacturing a thin film transistor, which includes the steps of 1) forming a gate electrode on a substrate; 2) forming an insulating layer on the substrate and the gate electrode; 3) forming a semiconductor layer on the insulating layer; and 4) forming a source electrode and a drain electrode by using a zinc oxide electrode material including one or more of Si, Mo, and W so as to be connected to the semiconductor layer.

In addition, the present invention provides a thin film transistor that includes a substrate, a gate electrode, an insulating layer, a semiconductor layer, a source electrode, and a drain electrode. The source electrode and the drain electrode are a zinc oxide electrode including one or more of Si, Mo, and W.

Advantageous Effects

In the present invention, since a zinc oxide electrode that has one or more of Si, Mo, and W is used as a source electrode and a drain electrode, a channel material of a semiconductor layer and the source electrode and the drain electrode can be selectively etched. Accordingly, a manufacturing process of a thin film transistor can be simplified and reliability of the thin film transistor can be ensured.

REFERENCE NUMERALS

Figure 1:
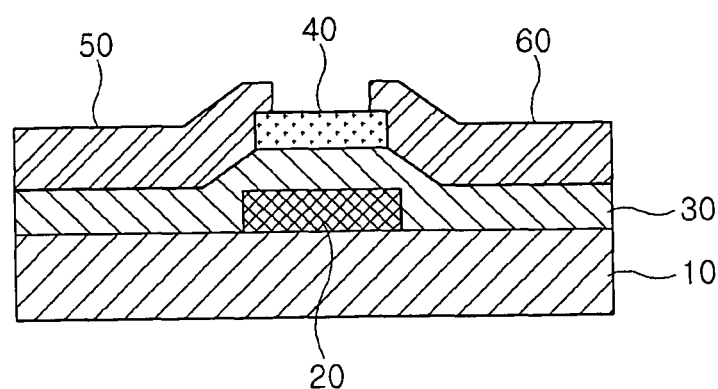
FIG. 1 is a view that schematically illustrates a section of a thin film transistor according to an embodiment of the present invention.
Figure 2:
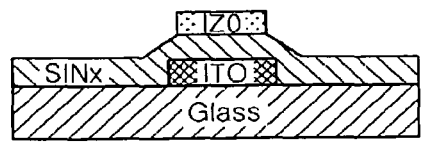
FIG. 2 is a process view that illustrates the production of a thin film transistor of a known lift-off process.
Figure 2:
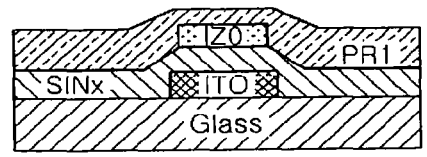
Figure 2:
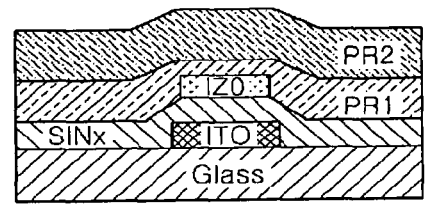
Figure 2:
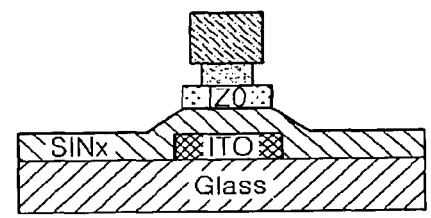
Figure 2:
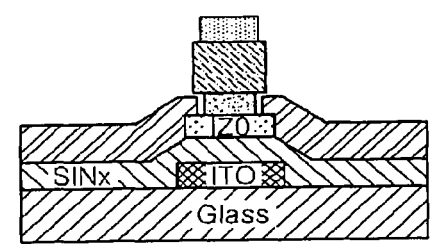
Figure 2:
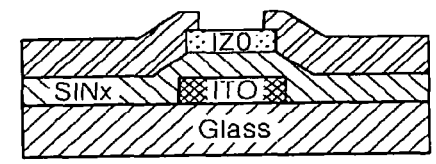
Figure 3:
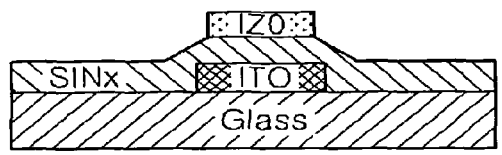
FIG. 3 is a process view that illustrates the production of a thin film transistor according to an embodiment of the present invention.
Figure 3:
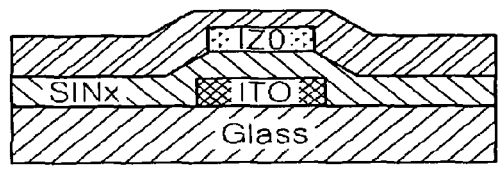
Figure 3:
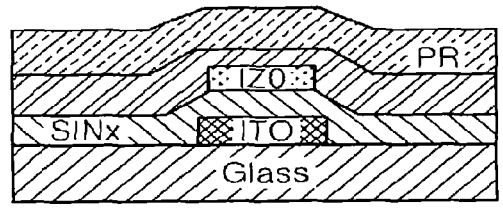
Figure 3:
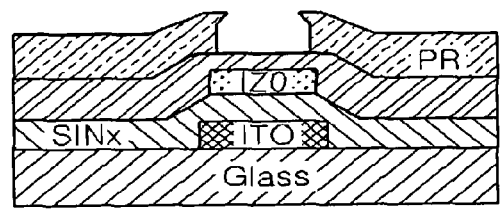
Figure 3:
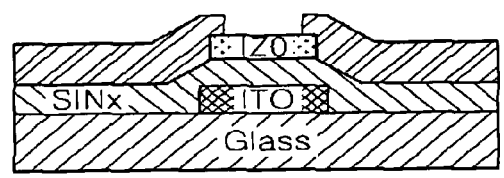

10: substrate
20: gate electrode
30: insulating layer
40: semiconductor layer
50: source electrode
60: drain electrode

BEST MODE FOR CARRYING OUT THE INVENTION

Hereinafter, the present invention will be described in detail.

A method of manufacturing a thin film transistor according to the present invention includes 1) forming a gate electrode on a substrate; 2) forming an insulating layer on the substrate and the gate electrode; 3) forming a semiconductor layer on the insulating layer; and 4) forming a source electrode and a drain electrode by using a zinc oxide electrode material including one or more of Si, Mo, and W so as to be connected to the semiconductor layer.

In the method of manufacturing a thin film transistor according to the present invention, in the forming of the gate electrode on the substrate of step 1), the substrate may be made of glass, semiconductor wafer, metal oxide, ceramic material and plastic that can satisfy thermodynamic and mechanical requirements in respects to the thin film transistor. In particular, the substrate is preferably made of glass or plastic, but the material of the substrate is not limited thereto.

The forming of the gate electrode on the substrate of step 1) may be performed by using a process including forming a conductive material layer using the conductive material on the substrate and patterning the conductive material layer to form an electrode pattern. In addition, the forming of the gate electrode on the substrate of step 1) may be performed by using a process including directly printing the conductive material on the substrate to perform patterning.

Examples of the conductive material in the forming of the gate electrode on the substrate of step 1) may include carton, aluminium, vanadium, chrome, copper, zinc, silver, gold, magnesium, calcium, sodium, potassium, titanium, indium, yttrium, lithium, gadolinium, tin, lead, similar metals, and an alloy thereof; p- or n-doped silicon; zinc oxide, indium oxide, indium tin oxide (ITO), indium zinc oxide, similar tin oxide and tin oxide indium-based complex compounds; ZnO: a mixture of oxides and metals such as Al, SnO2:Sb; and conductive polymers such as poly(3-methylthiophene), poly[3,4-(ethylene-1,2-dioxy)thiophene], polypyrrole and polyaniline, but are not limited thereto.

In the forming of the gate electrode on the substrate of step 1), in the step of forming the conductive material layer, a method that is selected from chemical vapor deposition (CVD), plasma-enhanced chemical vapor deposition (PECVD), sputtering, e-beam evaporation, thermal evaporation, laser molecular beam epitaxy (L-MBE), pulsed laser deposition (PLD), and atomic layer deposition may be used. The method of forming the conductive material layer is not limited thereto, but any method of forming a conductive material layer which is known in the art may be used.

In the forming of the gate electrode on the substrate of step 1), in the step of forming the electrode pattern, a process that is selected from a photolithographic process, an offset printing process, a silk screen printing process, an ink-jet printing process, and a process using a shadow mask may be used.

In the forming of the gate electrode on the substrate of step 1), the thickness of the gate electrode is in the range of preferably 50 to 400 nm, and more preferably 200 nm.

In the method of manufacturing the thin film transistor according to the present invention, examples of the material of the insulating layer in the forming of the insulating layer of step 2) include plastic insulators such as silicon oxide, silicon nitride; polyimide, poly(2-vinylpyrydine), poly(4-vinylphenol), polymethyl methacrylate, but are not limited thereto.

In the forming of the insulating layer of step 2), a method that is selected from chemical vapor deposition (CVD), plasma-enhanced chemical vapor deposition (PECVD), sputtering, e-beam evaporation, thermal evaporation, laser molecular beam epitaxy (L-MBE), pulsed laser deposition (PLD), and atomic layer deposition may be used. The method of forming the insulating layer is not limited thereto, but any method of forming an insulating layer which is known in the art may be used.

In the farming of the insulating layer of step 2), the thickness of the insulating layer is in the range of preferably 100 to 500 nm and more preferably 300 nm.

In the method of manufacturing the thin film transistor according to the present invention, in the forming of the semiconductor layer of step 3), the semiconductor layer includes ZnO and may be formed by using complex oxides including one or more of In, Ga, Sn, and Al.

The semiconductor layer on the gate insulating film may be consist of complex oxides such as ZTO (Zinc Tin Oxide), IGZO (Indium Gallium Zinc Oxide), ZAO (Zinc Aluminum Oxide), IZO (Indium Zinc Oxide) and ZnO (Zinc Oxide), and it is preferable that the molar ratio of Zn:Sn is 1:1 or 2:1, the molar ratio of Zn:Al is 1:1 or 2:1, the molar ratio of Zn:In is 1:1 or 2:1, the molar ratio of Zn:In:Ga is 1:1:1 or 2:1:1.

In the forming of the semiconductor layer of step 3), the semiconductor layer may be formed by using sputtering, chemical vapor deposition (CVD), atomic layer deposition, pulsed laser deposition (PLD), laser molecular beam epitaxy (L-MBE), e-beam evaporation, or ion-beam evaporation.

In the forming et the semiconductor layer of step 3), the thickness if the semiconductor layer is in the range of preferably 10 to 200 nm and more preferably 10 to 100 nm.

In the method of manufacturing the thin film transistor according to the present invention, the forming of the source electrode and the drain electrode of step 4) may be performed by using a process including forming a conductive material layer using the zinc oxide electrode material including one or more of Si, Mo, and W on the insulating layer and the semiconductor layer so that the insulating layer and the semiconductor layer are covered and patterning the conductive material layer to form an electrode pattern. In addition, the forming of the source electrode and the drain electrode of step 4) may be performed by using a process including directly printing the zinc oxide electrode including one or more of Si, Mo, and W on the insulating layer and the semiconductor layer to perform patterning.

In the forming of the source electrode and the drain electrode of step 4), the source electrode and the drain electrode may be deposited in an oxide form of ISZO (Indium Silicon Zinc Oxide), IMZO (Indium molybdenum Zinc Oxide), or ITZO (Indium Tungsten Zinc Oxide). The desirable content is as follows: $In_2O_3/ZnO/SiO$ (1:1:1 mol %), $In_2O_3/ZnO/MoO_3$ (1:1:1 mol %), and $In_2O_3/ZnO/WO_3$ (1:1:1 mol %). More preferably, the content of SiO, $MoO_3$, or $WO_3$ is 1 mol % or less.

In the forming of the source electrode and the drain electrode of step 4), in the step of forming the electrode, a method that is selected from chemical vapor deposition (CVD), plasma-enhanced chemical vapor deposition (PECVD), sputtering, e-beam evaporation, thermal evaporation, laser molecular beam epitaxy (L-MBE), pulsed laser deposition (PLD), and atomic layer deposition may be used The method of forming the electrode is not limited thereto, but any method of forming an electrode which is known in the art may be used.

In the forming of the source electrode and the drain electrode of step 4), in the step of forming the electrode pattern, a photolithographic process, a shadow mask process, an offset printing process, a silk screen printing process, an ink-jet printing process and the like may be used, but are not limited.

In the forming of the source electrode and the drain electrode of step 4), it is important that the conductivity is ensured as the electrode in the source electrode and the drain electrode. Preferably, the source electrode and the drain electrode have the specific resistance in the range of 0 to $10^{-3}$ ohm·cm or less, but not limited thereto. The content of Si, Mo, or W may be controlled so that the source electrode and the drain electrode have the appropriate specific resistance.

In the forming of the source electrode and the drain electrode of step 4), the thickness of each of the source electrode and the drain electrode is in the range of preferably 50 to 400 nm and more preferably 200 nm.

In addition, the present invention provides a method of manufacturing a thin film transistor, in which an etching process is performed in the forming of the source electrode and the drain electrode of step 4), and the etching process is a dry etching process using a fluorine gas.

The dry etching process may be performed by using a typical process that is known in the art.

In the dry etching process, fluorine gas may be used to etch Si, Mo, and W and to etch the zinc oxide source electrode and drain electrode including Si, Mo, or W. Accordingly, the channel material of the semiconductor layer and the source electrode and the drain electrode can be selectively etched. The selective etching may be performed base on the mechanism that fluorine of the fluorine gas is easily volatile landed to Si, W, or Mo to easily etch them and is not easily volatile bonded to Zn not to easily etch them.

Preferable examples of the fluorine gas include $CF_4$, $NF_3$, $SF_6$ and the like, but are not limited thereto.

In a specific embodiment of the dry etching process, the dry etching process may be performed under the etching condition such as ICP (Inductively Coupled Plasma) power 400 W, has power 20 W, $CF_4$ 45 sccm, $O_2$ 5 sccm, and the process pressure 5 mTorr.

In addition, the present invention provides a thin film transistor that includes a substrate; a gate electrode; an insulating layer; a semiconductor layer; a source electrode; and a drain electrode. The source electrode and the drain electrode are a zinc oxide electrode including one or more of Si, Mo, and W.

As described in the method of manufacturing the thin film transistor, the zinc oxide electrode including one or more of Si, Mo, and W may be deposited in an oxide form of ISZO (Indium Silicon Zinc Oxide), IMZO (Indium molybdenum Zinc Oxide), or ITZO (Indium Tungsten Zinc Oxide). The desirable content is as follows: $In_2O_3$/ZnO/SiO (1:1:1 mol %), $In_2O_3$/ZnO/$MoO_3$ (1:1:1 mol %), and $In_2O_3$/ZnO/$WO_3$ (1:1:1 mol %). More preferably, the content of SiO, $MoO_3$, or $WO_3$ is 1 mol % or less, but is not limited thereto.

In the thin film transistor according to the present invention, since the zinc oxide electrode including one or more of Si, Mo, and W is used as the source electrode and the drain electrode, the channel material of the semiconductor layer and the source electrode and the drain electrode are selectively etched. Thus, reliability of the thin film transistor may be improved.

Mode For the Invention

A better understanding of the present invention may be obtained in light of the following Examples which are set forth to illustrate, but are not to be construed to limit the present invention.

A method of manufacturing a thin film transistor according to an embodiment of the present invention includes 1) forming a gate electrode 20 on a substrate 10; 2) forming an insulating layer 30 on the gate electrode 20; 3) forming a semiconductor layer 40 on the insulating layer 30; and 4) forming a source electrode 50 and a drain electrode 60 by using a zinc oxide electrode material including one or more of Si, Mo, and W so as to be connected to the semiconductor layer 40.

Example

In step 1), after the indium tin oxide (ITO) film was deposited on the glass substrate 10 by using the sputtering method, the patterning was performed by using the photolithography method to form a plurality of gate wires and gate electrodes 20.

In step 2), the insulating layer 30 was formed on the upper surface of the glass substrate 10 on which the gate electrode wire was formed by using a sputtering method and the gate electrode 20 was formed by using the PECVD method. In connection with this, the gate insulating layer 30 was formed of SiNx.

In step 3), IZO was used to form the semiconductor layer 40 according to a sputtering method.

In step 4), after the ZnO layer including Si was deposited on the upper surface of the semiconductor layer 40 and the upper surface of the insulating layer 30 by using the sputtering method, the patterning was performed by using the photolithography method to form a data wire that crosses the gate wire and to form a source electrode 50 and a drain electrode 60.

Figure 4:
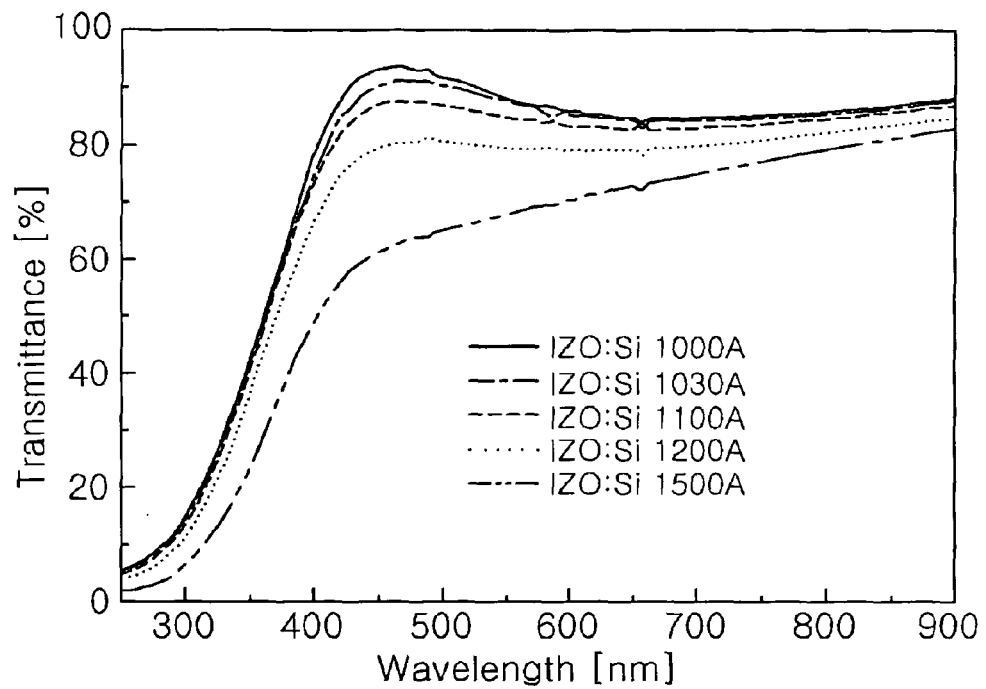
FIG. 4 is a view that illustrates permeation characteristics according to thicknesses of a source electrode and a drain electrode of the thin film transistor according to an embodiment of the present invention.
Figure 5:
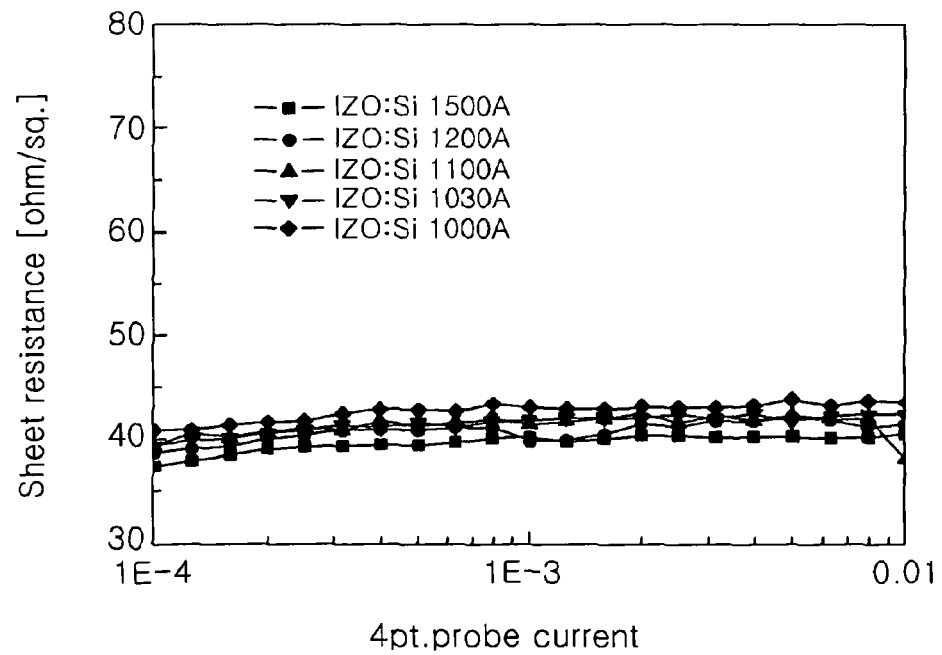
FIG. 5 is a view that illustrates in-plane resistances according to thicknesses of the source electrode and the drain electrode of the thin film transistor according to an embodiment of the present invention.

Permeation characteristics and in-plane resistance characteristics of the thin film transistor source electrode and drain electrode according to the thickness according to the embodiment are shown in FIGS. 4 and 5.

FIG. 4 illustrates permeation characteristics according to thicknesses of a source electrode and a drain electrode of the thin film transistor, in which transparency of 80% or more is obtained at a visible ray range and the permeation is reduced as the thickness is increased.

FIG. 5 illustrates in-plane resistances according to thicknesses of the source electrode and the drain electrode of the thin film transistor, in which when the source electrode and the drain electrode according to the present invention are used, there is no problem in terms of resistance.

The invention claimed is:

1. A method of manufacturing a thin film transistor, the method comprising the steps of:
   1) forming a gate electrode on a substrate;
   2) forming an insulating layer on the substrate and the gate electrode;
   3) forming a semiconductor layer on the insulating layer; and
   4) forming a source electrode and a drain electrode by using a zinc oxide electrode material comprising one or more of Si, Mo, and W so as to be connected to the semiconductor layer,
   wherein forming the source electrode and the drain electrode includes an etching,
   wherein the etching process is a dry etching process using a fluorine gas, and
   wherein in the forming of the source electrode and the drain electrode of step 4), the zinc oxide electrode further comprises $In_2O_3$/ZnO/SiO (1:1:1 mol %), $In_2O_3$/ZnO/$MoO_3$(1:1:1 mol %), or $In_2O_3$/ZnO/$WO_3$ (1:1:1 mol %).

2. The method of manufacturing a thin film transistor according to claim 1, wherein the forming of the source electrode and the drain electrode of step 4) is performed by using a process of forming a conductive material layer using the zinc oxide electrode material comprising one or more of Si, Mo, and W on the insulating layer and the semiconductor layer so that the insulating layer and the semiconductor layer are covered and patterning the conductive material layer to form an electrode pattern.

3. The method of manufacturing a thin film transistor according to claim 1, wherein in the forming of the source electrode and the drain electrode of step 4), the zinc oxide electrode comprising one or more of Si, Mo, and W is formed by depositing ISZO (Indium Silicon Zinc Oxide), IMZO (Indium molybdenum Zinc Oxide), or ITZO (Indium Tungsten Zinc Oxide) in an oxide form.

4. The method of manufacturing a thin film transistor according to claim 1, wherein in the forming of the source electrode and the drain electrode of step 4), the specific resistance of each of the source electrode and the drain electrode is more than 0 and $10^{-3}$ ohm·cm or less.

5. The method of manufacturing a thin film transistor according to claim 1 wherein the fluorine gas is $CF_4$, $NF_3$ or $SF_6$.

6. The method of manufacturing a thin film transistor according to claim 1, wherein in the forming of the source electrode and the drain electrode of step 4), thickness of each of the source electrode and the drain electrode is in the range of 50 to 400 nm.

7. The method of manufacturing a thin film transistor according to claim 1, wherein in the forming of the gate electrode on the substrate of step 1), the substrate is selected from the group consisting of glass, semiconductor wafer, metal oxide, ceramic material and plastic.

8. The method of manufacturing a thin film transistor according to claim 1, wherein the forming of the gate electrode on the substrate of step 1) is performed by using a process of forming a conductive material layer using the conductive material on the substrate and patterning the conductive material layer to form an electrode pattern; or a process of directly printing the conductive material on the substrate to perform patterning.

9. The method of manufacturing a thin film transistor according to claim 1, wherein the forming of the semiconductor layer of step 3) is performed by using the complex oxide comprising ZnO and one or more of In, Ga, Sn, and Al.

10. The method of manufacturing a thin film transistor according to claim 9, wherein in the forming of the semiconductor layer of step 3), the complex oxide is selected from the group consisting of ZTO (Zinc Tin Oxide), IGZO (Indium Gallium Zinc Oxide), ZAO (Zinc Aluminum Oxide), IZO (Indium Zinc Oxide) and ZnO (Zinc Oxide).

11. The method of manufacturing a thin film transistor according to claim 9, wherein in the forming of the semiconductor layer of step 3), a molar ratio of Zn:Sn is 1:1 or 2:1, a molar ratio of Zn:Al is 1:1 or 2:1, a molar ratio of Zn:In is 1:1 or 2:1, or a molar ratio of Zn:In:Ga is 1:1:1 or 2:1:1 in the complex oxide.

12. A thin film transistor comprising a substrate; a gate electrode; an insulating layer; a semiconductor layer; a source electrode; and a drain electrode,
wherein the source electrode and the drain electrode are a zinc oxide electrode comprising one or more of Si, Mo, and W, and the zinc oxide electrode comprising one or more of Si, Mo, and W is formed by performing a dry etching process using a fluorine gas, and
wherein the zinc oxide electrode further comprises $In_2O_3$/ZnO/SiO (1:1:1 mol %), $In_2O_3$/ZnO/$MoO_3$ (1:1:1 mol %), or $In_2O_3$/ZnO/$WO_3$ (1:1:1 mol %).

13. The thin film transistor according to claim 12, wherein the zinc oxide electrode comprising one or more of Si, Mo, and W comprises oxides of ISZO (Indium Silicon Zinc Oxide), IMZO (Indium molybdenum Zinc Oxide), or ITZO (Indium Tungsten Zinc Oxide).

14. The thin film transistor according to claim 12, wherein the specific resistance of the zinc oxide electrode comprising one or more of Si, Mo, and W is more than 0 and $10^{-3}$ ohm·cm or less.

* * * * *